United States Patent [19]

Ohtagaki et al.

[11] Patent Number: 5,534,443
[45] Date of Patent: Jul. 9, 1996

[54] METHOD OF MANUFACTURING A SOLID STATE IMAGING DEVICE

[75] Inventors: Tomoko Ohtagaki, Kyoto; Yoshikazu Sano, Osaka, both of Japan

[73] Assignee: Matsushita Electronics Corporation, Osaka, Japan

[21] Appl. No.: 408,974

[22] Filed: Mar. 23, 1995

[30] Foreign Application Priority Data

Mar. 25, 1994 [JP] Japan .................................. 6-055551

[51] Int. Cl.⁶ .................................................. H01L 31/18
[52] U.S. Cl. ........................................ 437/2; 437/3; 437/5
[58] Field of Search .................................. 437/2, 3, 4, 5, 437/127, 905; 148/DIG. 99

[56] References Cited

U.S. PATENT DOCUMENTS

| | | | |
|---|---|---|---|
| 3,963,495 | 6/1976 | Kato et al. | 430/232 |
| 4,052,379 | 10/1977 | Gourley | 534/768 |
| 5,404,005 | 4/1995 | Shimomura et al. | 250/208.1 |

FOREIGN PATENT DOCUMENTS 130102A  5/1989  Japan .

Primary Examiner—Tom Thomas
Assistant Examiner—Kevin M. Picardat
Attorney, Agent, or Firm—Fish & Richardson

[57] ABSTRACT

The method of manufacturing a solid state imaging device of the invention comprises a step of adding carboxylate as a dyeing assistant auxiliary to the aqueous dyestuff solution when forming dyeing layers of acrylic-based resin on a semiconductor substrate on which a solid state imaging element is formed. Therefore this invention provides a solid state imaging device with a color filter which is dyed densely, is flat, thin, and excellent in spectral characteristics. A transparent planarization resin layer (the material is e.g. acrylic) is formed on a semiconductor substrate, and a shading layer and planarization resin layer are successively formed thereon. A synthetic resin is prepared and added photosensitizer of diazo compound. On the above-mentioned planarization resin layer, the layer of the synthetic resin is coated to be 0.2 to 0.8 μm thick, for example, by a spin coat method. Then the synthetic resin is selectively exposed with a stepper, and developed to form patterns of a color filter. Then, the resin with the pattern is dyed to be a cyan layer. In the step, ammonium acetate and a urea compound are added to the aqueous dyestuff solution.

14 Claims, 13 Drawing Sheets

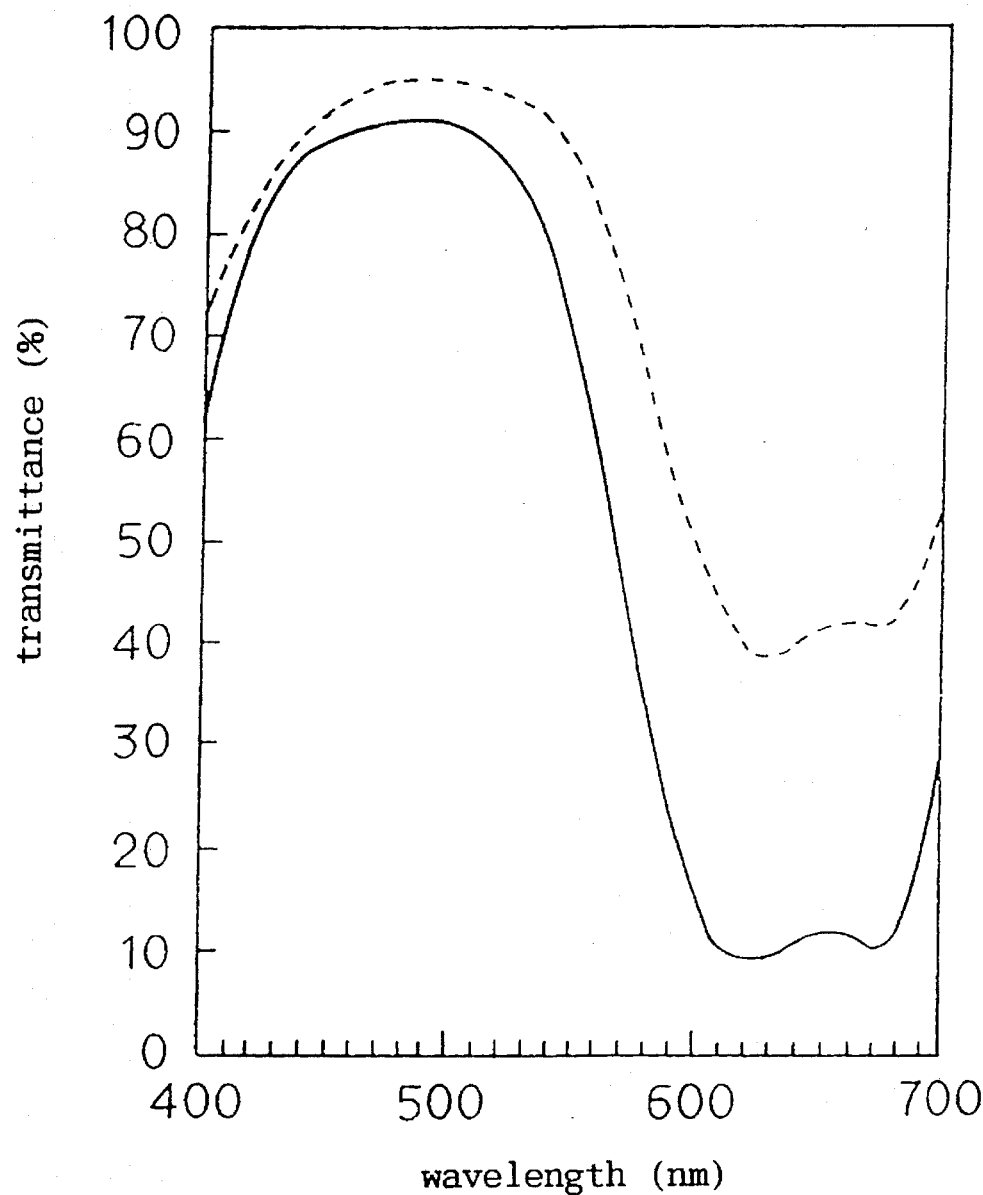
F I G. 3

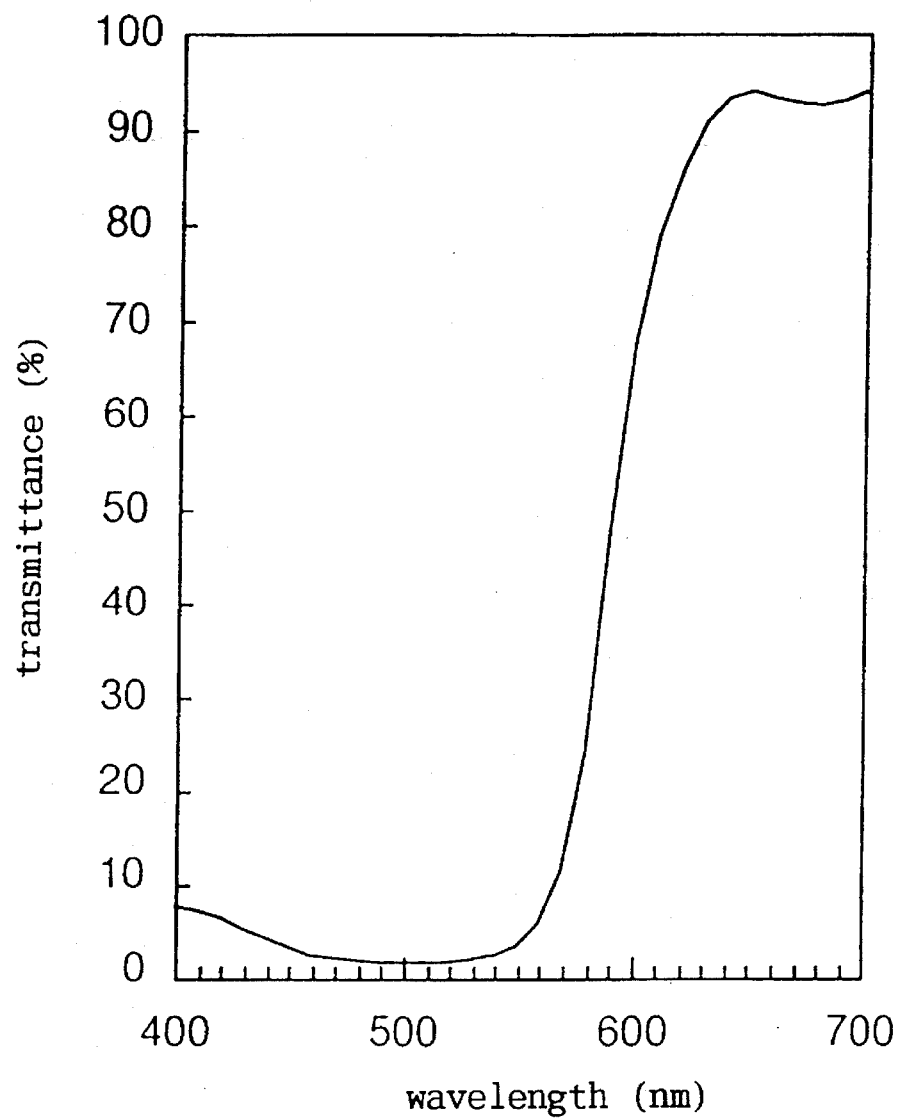
F I G. 8

1

METHOD OF MANUFACTURING A SOLID STATE IMAGING DEVICE

FIELD OF THE INVENTION

This invention relates to a method of manufacturing a solid state imaging device comprising two types, namely, a charge coupled device (hereinafter abbreviated as CCD) and a metal oxide semiconductor (hereinafter abbreviated as MOS). More specifically, this invention relates to a method of dyeing layers on a semiconductor substrate on which a solid state imaging element is formed.

BACKGROUND OF THE INVENTION

Due to the recent trend toward miniaturizing solid state imaging devices and improving the quality of pixels, several problems have been noted. For instance, sensitivity deteriorates because of a decrease in the photo-conversion area, and the smear characteristics degrade under the influence of oblique rays, since the space between adjacent photo-conversion parts has been reduced. Smear characteristic is a phenomenon that occurs when oblique rays from a photo-diode generate free electrons at the bottom of a solid state imaging device and are captured by the solid state imaging device. In order to solve such problems, solid state imaging devices for general use are equipped with microlens layers on the photo-conversion part, or equipped with shading layers. The photo-conversion area should be decreased in order to improve the quality of miniaturizing CCD's pixels. Thus it may be necessary to miniaturize a photo-conversion body, which will shorten the focal length. As a result, a filter is required to be thinner so that it is easier to condense rays with a microlens. Furthermore, it is necessary to raise the photo-absorption rate of the shading layer in order to improve the smear characteristics, since the oblique rays influence on the smear characteristics.

As a method of manufacturing color filters, Japanese Laid Open Patent Application No. (Tokkai-Hei) 1-130102 discloses the use of m-nitrobenzenesulfonate and/or urea as dyeing assistant auxiliaries. A dyeing assistant auxiliary is used to promote dyeing.

However, the conventional method of manufacturing color solid state imaging devices causes problems such as surface roughness, which occurs when the surface of a filter becomes slightly rough or uneven. Desirable spectral characteristics cannot be easily obtained due to surface roughness.

SUMMARY OF THE INVENTION

It is an object of this invention to solve the above-mentioned problems by providing a method of manufacturing a solid state imaging device with a color filter which is easily dyed, has a flat surface and desirable spectral characteristics.

In order to accomplish these and other objects and advantages, the method of manufacturing a solid state imaging device of the invention comprises adding carboxylate as a dyeing assistant auxiliary to a solution of aqueous dyestuffs when forming dyeing layers of acrylic-based resin on a semiconductor substrate on which a solid state imaging element is formed.

It is preferable in the invention that the carboxylate is at least one salt selected from the group consisting of ammonium carboxylate and alkali metal carboxylate.

It is also preferable in the invention that the alkali metal carboxylate is at least one salt selected from the group consisting of sodium carboxylate and potassium carboxylate.

It is further preferable in the invention that the alkali metal carboxylate is at least one salt of carboxylic acid salt selected from the group consisting of formic acid, acetic acid, propionic acid, n-butyric acid, isobutyric acid, valeric acid, trimethyl acetic acid, acryl acid, and methacryl acid.

It is preferable in the invention that the carboxylate is added in an amount of from 0.05 to 2 weight percent (hereinafter wt. %) based on amount of aqueous dyestuff solution.

It is also preferable in the invention that a urea compound is also added to the aqueous dyestuff solution in an amount of 0.1 to 10 wt. % based on amount of aqueous dyestuff solution.

It is further preferable in the invention that the urea compound is $C_qH_rO_sN_t$ where q is from 1 to 5, r is from 4 to 10, s is 1, and t is 2.

It is preferable in the invention that the urea compound is ethyleneurea (2-imidazolidone).

It is preferable in the invention that the planarization resin layers and the shading layer are formed on the semiconductor substrate on which the solid state imaging element is formed and multicolor dyeing layers are formed thereon. A planarization resin layer passes outside lights efficiently to the surface of a photoconversion area. A shading layer blocks lights which come through adjacent lenses and other dyeing layers.

It is preferable in the invention that the color of the multicolor dyeing layers are at least one selected from the group consisting of yellow, cyan, magenta, and green.

It is preferable in the invention that the color of the multicolor dyeing layers are at least one selected from the group consisting of red, blue, and green.

It is preferable in the invention that the planarization resin layers and the shading layer are formed successively on the semiconductor substrate on which the solid state imaging element is formed, and the shading layer consists of a monocolor dyeing layer.

It is preferable in the invention that the color of the monocolor dyeing layer is black.

It is preferable in the invention that the dyeing layers are manufactured as follows:

forming an acrylic-based resin layer (A), dyeing the acrylic-based resin layer (A) a color, and fixing the dye;

forming a second acrylic-based resin layer (B), dyeing the acrylic-based resin layer (B) another color, and fixing the dye.

It is preferable in the invention that the acrylic-based resin layer (A) and the acrylic-based resin layer (B) are adjacent or partly overlapping each other from a cross-sectional view.

As described above, a solid state imaging device of the invention can be employed for CCD and MOS, both of which are well known to any person skilled in the art.

The method of manufacturing a solid state imaging device of the invention comprises adding carboxylate as a dyeing assistant auxiliary to the aqueous dyestuff solution when forming dyeing layers of acrylic-based resin on a semiconductor substrate on which a solid state imaging element is formed. Therefore this invention provides a solid state imaging device with a color filter which is dyed densely, is flat, thin, and excellent in spectral characteristics. Moreover, the method of the invention can increase yield in manufacturing a solid state imaging device, since particles, which are generated from aggregation of additives such as dyestuffs, decrease during a dye bath.

Furthermore, this invention provides preferable spectra by using thin films, thus provides thinner color filter layer (from a photo-conversion part to a microlens). Therefore the focal length of the lens becomes shorter, and the condensing rate can be improved. As a result, sensitivity of the photo-conversion part will be improved even if the image sensing scene gets dark and the optical diaphragm is open. In addition, smear characteristics will be improved by raising the photo-absorption rate of the shading layer.

According to a preferable embodiment of the invention the carboxylate is at least one salt selected from the group consisting of ammonium carboxylate and alkali metal carboxylate. Therefore, it is possible not only to dye more densely and avoid surface roughness of filters, but also to decrease particles which are generated from aggregation of additives such as dyestuff in the aqueous dyestuff solution.

According to a preferable embodiment of the invention the alkali metal carboxylate is at least one salt selected from the group consisting of sodium carboxylate and potassium carboxylate. Therefore, it is possible not only to dye more densely and avoid surface roughness of filters, but also to decrease particles which are generated from aggregation of additives such as dyestuff in the aqueous dyestuff solution.

It is also preferable in the invention that the carboxylate is at least one carboxylic acid salt selected from the group consisting of formic acid, acetic acid, propionic acid, n-butyric acid, isobutyric acid, valeric acid, trimethyl acetic acid, acryl acid, and methacryl acid. As a result, it is possible to dye more densely and avoid surface roughness of filters, as well as to decrease particles which are generated from aggregation of additives such as dyestuff in the aqueous dyestuff solution.

It is possible to carry out the above-mentioned step more efficiently if the carboxylate is added in the amount of from 0.05 to 2 wt. %. If the amount of the caboxylate is less than 0.05 wt. %, it will be more difficult to dye densely. Moreover, it will be more difficult to control particles which are generated by aggregation of additives such as dyestuffs in the aqueous dyestuff solution. It is also difficult to prevent surface roughness of the filter. Adding carboxylate in an amount of over 2 wt. % does not improve the quality so much, while it raises the production cost.

It is further preferable in the invention to add a urea compound in an amount of from 0.1 to 10 wt. % to the above-mentioned aqueous dyestuff solution. Therefore it is possible to dye more densely in some predetermined dyestuffs and to avoid surface roughness of filters, as well as to decrease particles which are generated from aggregation of additives such as dyestuffs in aqueous dyestuff solution. As the urea compound, $C_qH_rO_sN_t$ is preferable where q is from 1 to 5, r is from 4 to 10, s is 1, and t is 2. Ethyleneurea (2-imidazolidone) is particularly preferable.

It is possible to form planarization resin layers and a shading layer on a semiconductor substrate on which a solid state imaging element is formed, and multicolor dyeing layers (a color filter layer) are formed thereon successively. In this embodiment, the shading layer is dyed black, and the color filter is dyed multicolor. The multicolor dyeing layers are dyed at least one color selected from the group consisting of yellow, cyan, megenta, and green. Or the multicolor dyeing layers are dyed at least one color selected from the group consisting of red, blue, and green. Solid state imaging devices with color filters are employed for video cameras for private use and others.

In another embodiment, it is also possible to form a planarization resin layer, a shading layer comprising a monocolor dyeing layer (black) successively on a semiconductor substrate on which a solid state imaging element is formed. Solid state imaging devices which are manufactured in this embodiment can be employed for monocolor (white and black) cameras for various uses such as viewing, medical, and business.

In the invention, it is possible to form a color filter efficiently according to the following steps:

forming an acrylic-based resin layer (A), dyeing the aclylic-based layer (A) a predetermined color, and fixing the dye;

forming another acrylic-based resin layer (B), dyeing the acrylic-based resin layer (B) another color, and fixing the dye.

It is preferable that the acrylic-based resin layer (A) and the acrylic-based resin layer (B) are adjacent or partly overlapping each other from a cross-sectional view.

As described above, the method of manufacturing a solid state imaging device of the invention comprises adding carboxylate as a dyeing assistant auxiliary to the aqueous dyestuff solution when forming dyeing layers of acrylic-based resin on a semiconductor substrate on which a solid state imaging element is formed. Therefore this invention provides a solid state imaging device a with color filter which is dyed densely, is flat, thin, and excellent in spectral characteristics. Moreover, the method of the invention can improve yield in manufacturing a solid state imaging device, since particles which are generated from aggregation of additives such as dyestuffs decrease.

Furthermore, this invention provides preferable spectrum by using thin film, thus provides thinner color filter layer which comprises from photo-conversion part to microlenses. Therefore focal length of the lens becomes shorter and the condensing rate can be improved. As a result, sensitivity of the photo-conversion part will be improved even if the image sensing scene gets dark and the optical diaphragm is open. In addition, smear characteristics will be improved by raising photo-absorption rate of the shading layer.

BRIEF DESCRIPTION OF THE DRAWINGS

FIG. 3 indicates the spectral characteristics of the color filter of Example 1 of the invention.

FIG. 8 indicates the spectral characteristics of the color filters of Example 2 of the invention.

DETAILED DESCRIPTION OF THE INVENTION

Figure 1:
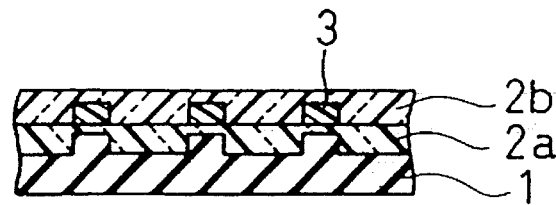
FIG. 1(a) to FIG. 1(f) are cross-sectional views showing the method of manufacturing the color solid state imaging device of Example 1 of this invention.
Figure 1:
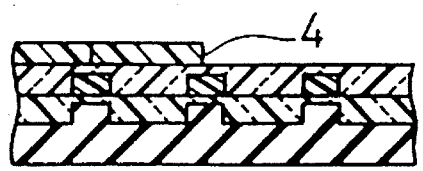
Figure 1:
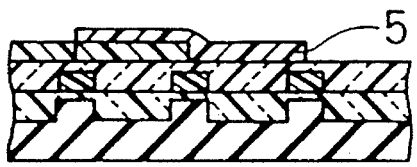
Figure 1:
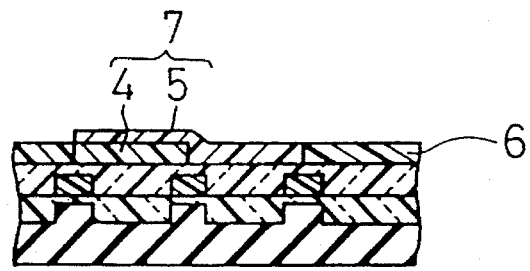
Figure 1:
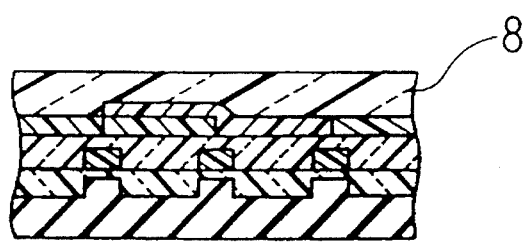
Figure 1:
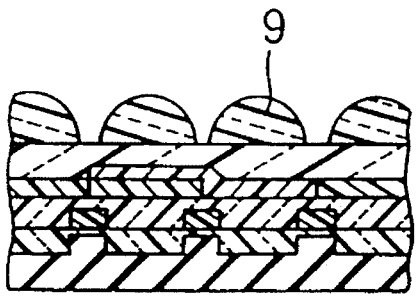

The following is a method of manufacturing a solid state imaging device of one embodiment of the invention.

A planarization resin layer made of a transparent material such as acrylic resin is formed on a wafer on which a solid state imaging element is formed, and forming a shading layer and another planarization resin layer successively.

The planarization resin layer is coated with a dyeable material layer (a layer to be dyed) which consists of synthetic resin, exposing selectively, and developing to form a predetermined pattern.

The above-mentioned pattern is dyed in a aqueous dyestuff solution of predetermingly adjusted yellow dye in order to form a yellow layer.

The dye is fixed with adhering agent such as tannic acid aqueous solution and potassium antimonyl-tartrate solution to prevent decolor and mixture of colors.

The layers are coated with another dyeable material layer which consists of synthetic resin, and forming a cyan layer in the same manner of the yellow layer.

A magenta layer is formed according to the above-mentioned manner.

A green layer is formed where the yellow layer and the cyan layer are overlapping each other.

The color filter layer is coated with a planarization layer of transparent materials such as acrylic resin layer in order to flatten the surface of the color filters.

The layers are coated with a lens material resin and the material is exposed selectively, and developed to be the lens material resin layer which is almost square shape from a horizontal view.

The above-mentioned lens material resin layer is formed into a microlens by heating it to be melt.

The followings are illustrative examples of the invention.

EXAMPLE 1

FIG. 1(a) to FIG. 1(f) are a flow chart of cross-sectional views showing the method of manufacturing a color solid state imaging device of one embodiment of the invention. In FIG. 1(a) to FIG. 1(f), number 1 is a semiconductor substrate whereon a solid state imaging element is formed. 2a and 2b are planarization resin layers of acrylic resin which are 0.2 to 0.8 μm in thickness (0.6 μm in this example). 3 is a shading layer of methacrylate resin which is 0.1 to 0.5 μm in thickness (in this example, 0.3 μm). 4 is a yellow layer of methacrylate resin which is 0.2 to 1.0 μm in thickness (in this example, 0.8 μm). 5 is a cyan layer of methacrylate resin which is 0.2 to 1.0 μm in thickness (in this example, 0.5 μm). 6 is a magenta layer which is 0.2 to 1.0 μm in thickness (in this example, 0.3 μm). 7 is a green layer which is 0.4 to 2.0 μm in thickness (in this example, formed with overlapping yellow layer 4 and cyan layer 5). 8 is a planarization layer of acrylic resin which is 0.3 to 1.0 μm in thickness (in this example, 0.6 μm). 9 is a microlens which is 1.5 to 3.0 μm at the thickest part (in this example, 2.2 μm).

A transparent planarization resin layer 2a of acrylic resin is formed on a semiconductor substrate 1 whereon a solid state imaging element is formed, and subsequently, a shading layer 3, and another planarization resin layer 2b are formed (FIG. 1 (a)).

A synthetic resin (methacrylate resin) was prepared and a photosensitizer of commercially available diazo compound was added to the resin. As the diazo compound, for example, [Ar—N$^+$≡N]X$^-$ (Ar is Aryl group) was used. On the above-mentioned planarization resin layer 2b, the layer of the synthetic resin was coated to be 0.2 to 0.8 μm thick by, for example, a spin coat method. Then, tile synthetic resin was selectively exposed with a stepper, and developed to form patterns of a color filter. The pattern is almost a square of 4 to 5 μm from a horizontal view. Then, the resin with the pattern was dyed to be a cyan layer 4 (FIG. 1(b)). In this step, ammonium acetate and ethyleneurea (2-imidazolidone) were added to the aqueous dyestuff solution. The amount of the additives are described below.

Figure 2:
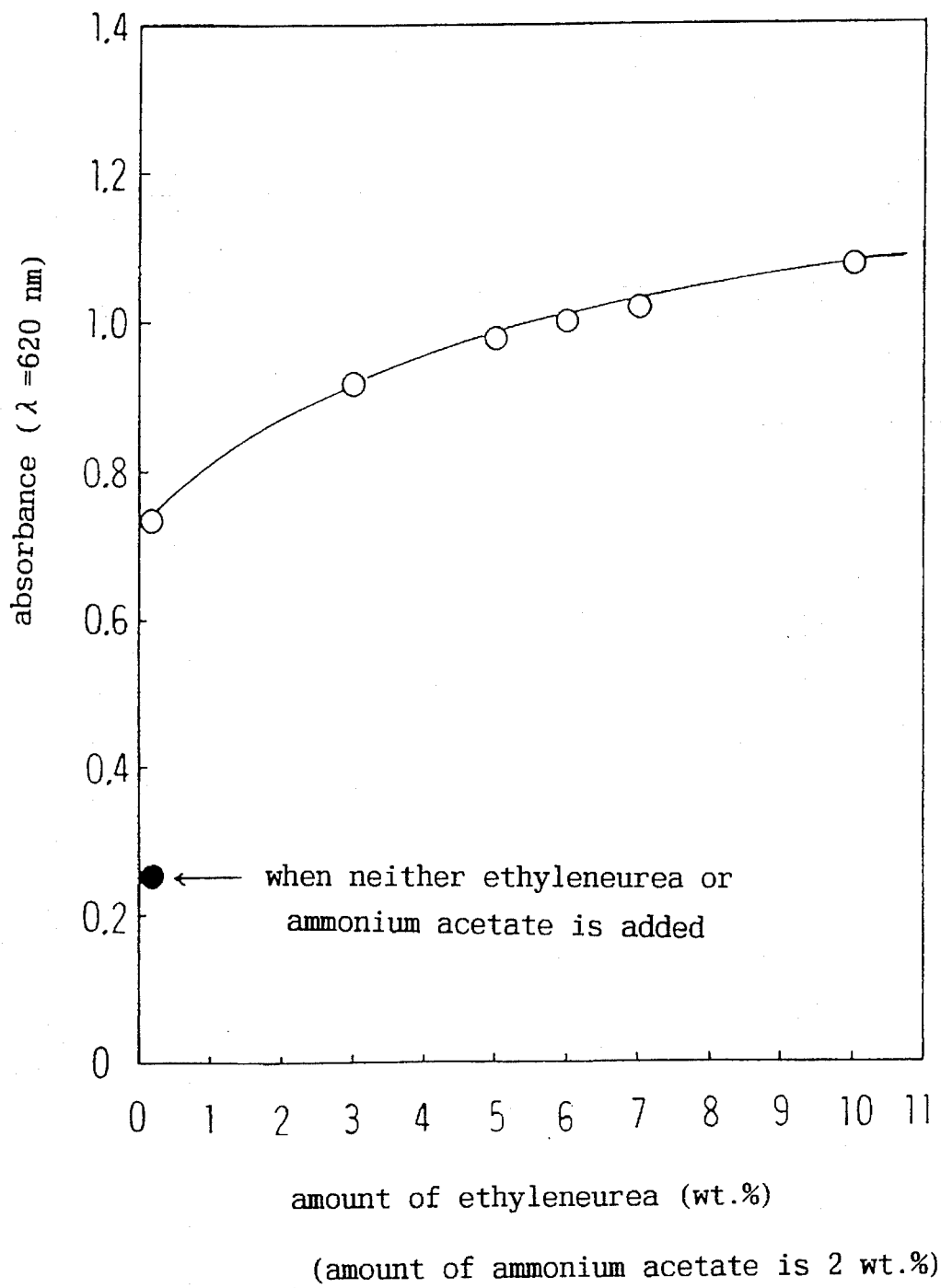
FIG. 2 indicates the relation between the amount of additives (ammonium acetate and urea compound) and the absorbance of the filter of Example 1 of this invention.

FIG. 2 shows the relation between the photo-absorption rate (λ=620 nm) of the spectrum of the dyed filter and the amount of additives (ammonium acetate and ethyleneurea). It is clear from the graph that ammonium acetate alone can promote dyeing, however dyeing is further promoted by adding ammonium acetate and ethyleneurea simultaneously because of a multiple effect. When ammonium acetate of 2 wt. % or more was added, crystals appeared in the dyeing solution and particles increase. When ethyleneurea of 10 wt. % or more was added, molecules of excessive dyestuffs penetrate into the filters and can cause cracks in the filters. To prevent such problems, the additives were added to the aqueous dyestuff solution in the rate of the following description.

| | |
|---|---|
| (1) cyan dyestuff (NIPPON KAYAKU Co., Ltd., copper phthlocyanine dye, trade name: Pc Cyan) | 2 weight parts |
| (2) pure water | 838 weight parts |
| (3) ammonium acetate | 20 weight parts |
| (4) ethyleneurea | 60 weight parts |

The dyeing was carried out at the temperature of 70° C. for 20 minutes.

FIG. 3 shows the spectral characteristics of the filter of 0.7 μm thick which was formed in the above-mentioned aqueous dyestuff solution. It is clear from the graph that the preferable spectrum appears even if the filter is thin.

After being dyed, the dyeing layers were treated in a solution such as tannic acid aqueous solution and potassium antimonyl-tartrate solution to fix the dyestuffs and to prevent decoloring and color-mixing (FIG. 1(b)).

Next, a yellow layer 5 was formed by being dyed with the following yellow dyestuff in the same manner of the above mentioned cyan layer 4 (FIG. 1(c)).

| | |
|---|---|
| (1) yellow dyestuff (NIPPON KAYAKU Co., Ltd., azoic dye, trade name: Pc Yellow) | 1 weight part |
| (2) pure water | 999 weight parts |

The dyeing was carried out at the temperature of 70° C. for 20 minutes.

A magenta layer 6 was formed in the same manner as mentioned above (FIG. 1(d)).

| | |
|---|---|
| (1) magenta dyestuff (NIPPON KAYAKU Co., Ltd., xanthene dye, trade name: Pc Magenta) | 1 weight part |
| (2) pure water | 999 weight parts |

The dyeing was carried out at the temperature of 40° C. for 10 minutes.

A green layer 7 was formed as the overlapping part of the above-mentioned yellow layer 4 and cyan layer 5.

Subsequently the color filter was coated with a transparent planarization layer 8 of acrylic resin to flatten the surface of the color filter (FIG. 1(e)). Then microlens 9 was formed by coating lens material of 0.3 to 1.0 µm thick, exposing selectively, developing, and treating with heat (FIG. 1(f)). As a material for the lens, a resin such as polyparavinylphenol resin was prepared and dissolved in a solution of cellosolve acetate solvent. Then the resin was coated to be 2.2 µm thick when dried. The lenses were formed by irradiating at g line (436 nm) by masking at 100 mJ/cm$^2$, removing exposed parts by using organic alkali developer, and treating with heat of about 150° C. for 5 minutes. Then the polymer was melted to be a hemispherical lens.

In the example, the thickness of the color filter (from the solid state imaging element to the bottom of the microlens 9) was 4.0 to 4.5 µm.

Figure 4:
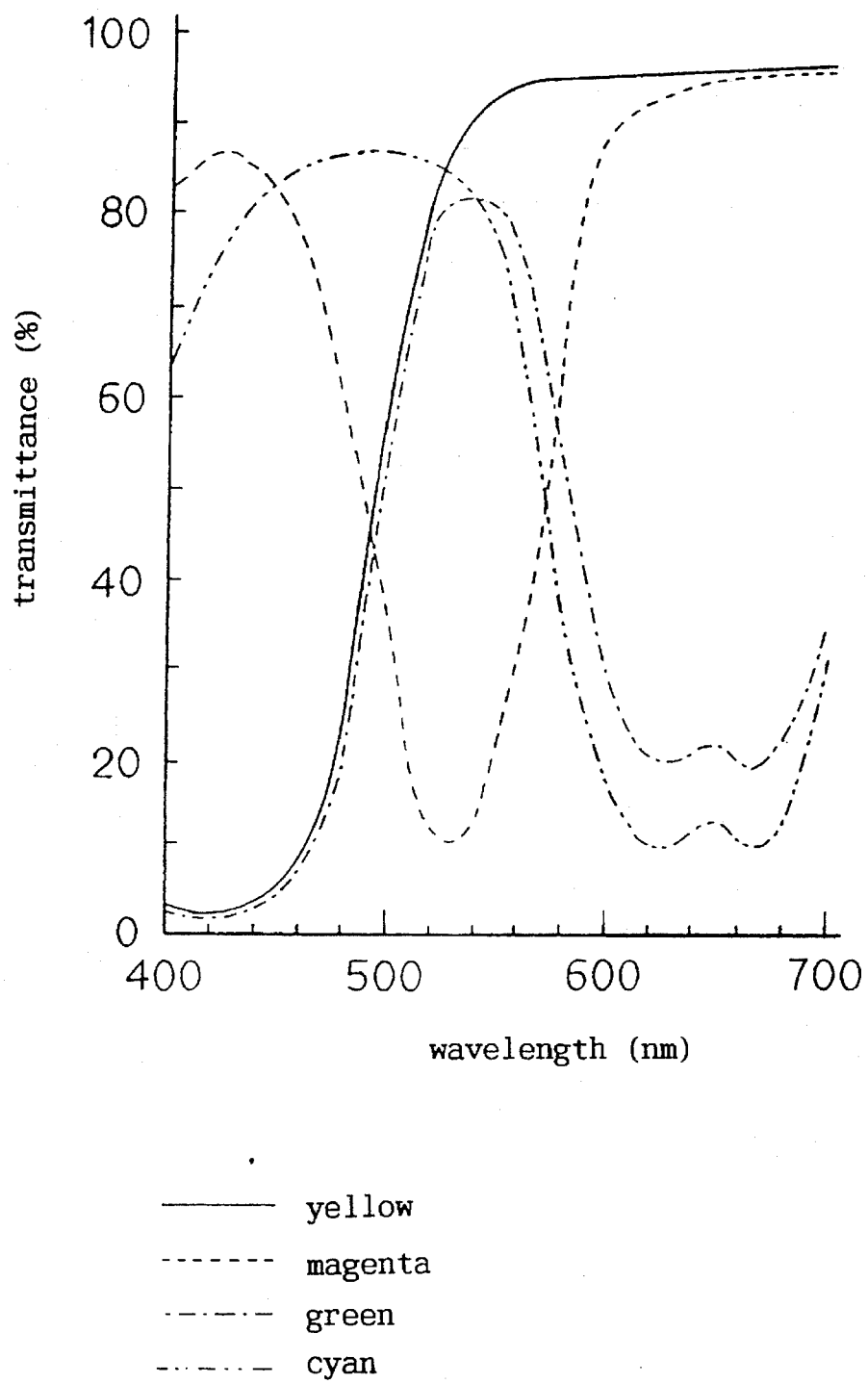
FIG. 4 indicates spectral characteristics of the colors of the color filters of Example 1 of the invention.

FIG. 4 shows spectral characteristics of the colors of the color filter of this example.

The order of the filter forming method of the invention is not necessarily limited to the above-mentioned illustrative example.

EXAMPLE 2

FIG. 5(a) to FIG. 5(f) are a flow chart of cross-sectional views showing the method of manufacturing a color solid state imaging device of one embodiment of the invention. In FIG. 5(a) to 5(f), number 10 is a semiconductor substrate on which a solid state imaging element is formed. 11a and 11b are planarization resin layers, 12 is a shading layer, 13 is a red layer, 14 is a blue layer, 15 is a green layer, 16 is a planarization resin layer, and 17 is a microlens.

Figure 5:
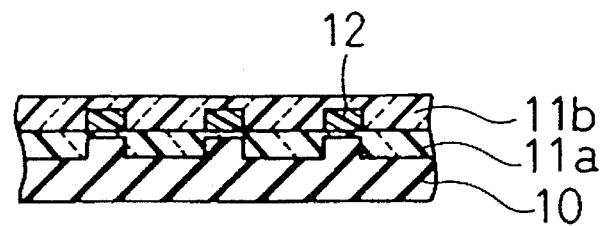
FIG. 5(a) to FIG. 5(f) are cross-sectional views showing the method of manufacturing the solid state imaging device of Example 2 of this invention.
Figure 5:
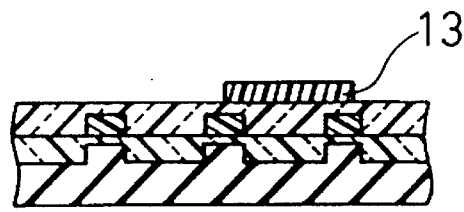
Figure 5:
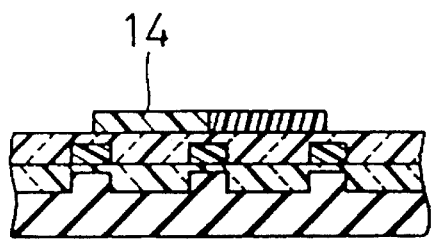
Figure 5:
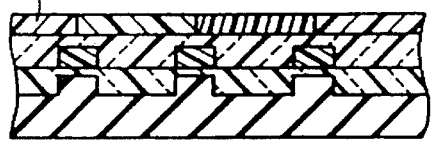
Figure 5:
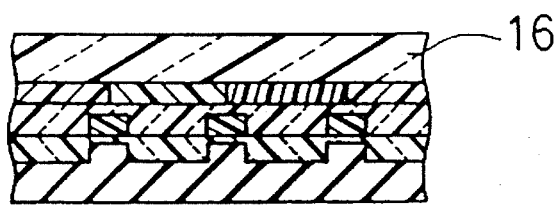
Figure 5:
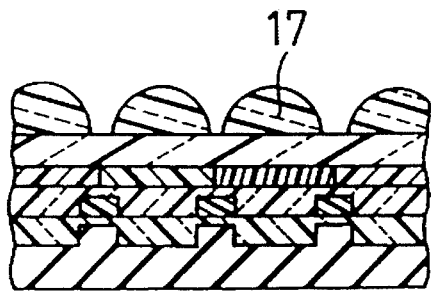

A transparent planarization resin layer 11a (the material is e.g. acrylic resin) is formed on a semiconductor substrate 10 whereon a solid state imaging element is formed, and a shading layer 12, and a planarization resin layer 11b are formed thereon successively (FIG. 5(a)).

Photosensitizer of diazo compound was added to synthetic resin to be dyed (methacrylate resin) in the same manner of Example 1. On the planarization resin layer 11b, the dyeable material layer of the synthetic resin was coated to be 0.2 to 0.8 µm thick, for example, by a spin coat method. Then, the synthetic resin was selectively exposed with a stepper, and developed to form patterns of a color filter. Then, the resin with the pattern was dyed to be a red layer 13. In the step, sodium acetate was added to the aqueous dyestuff solution.

Figure 6:
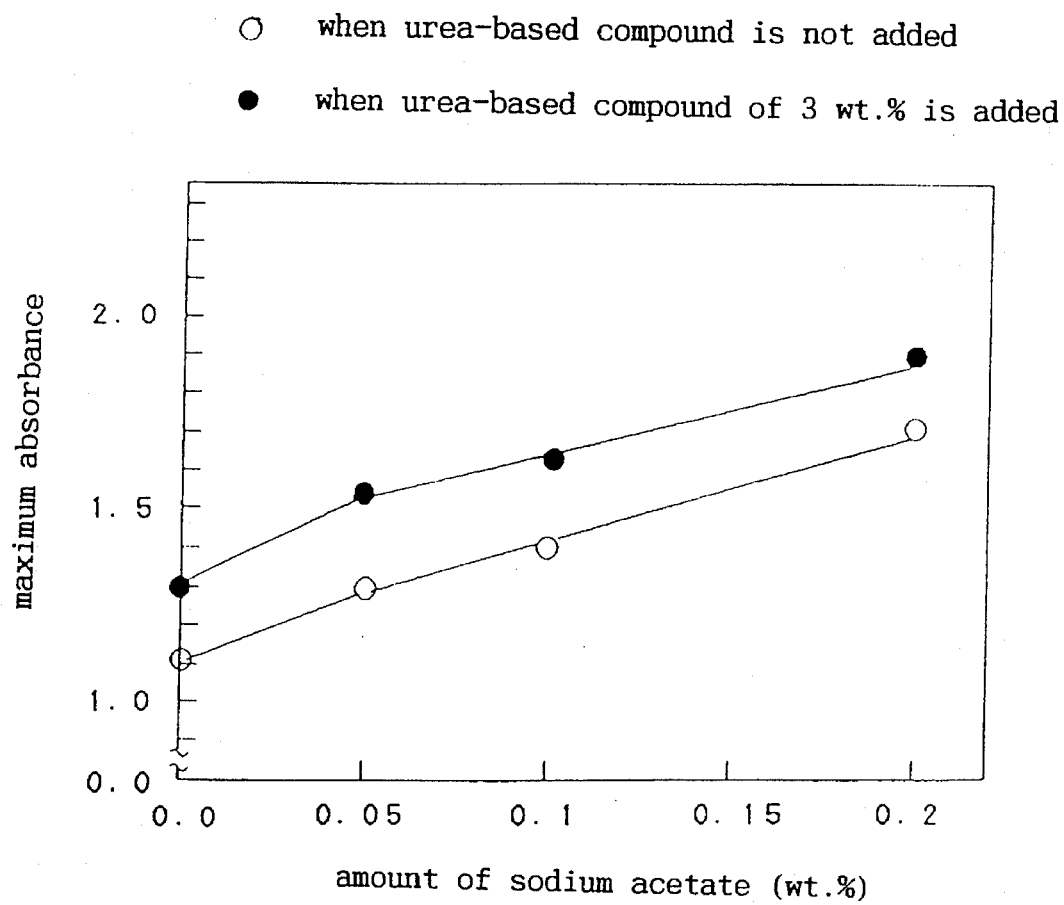
FIG. 6 indicates the relation between the amount of additives (sodium acetate and urea compound) and the absorbance of the filters of Example 2 of this invention.
Figure 7:
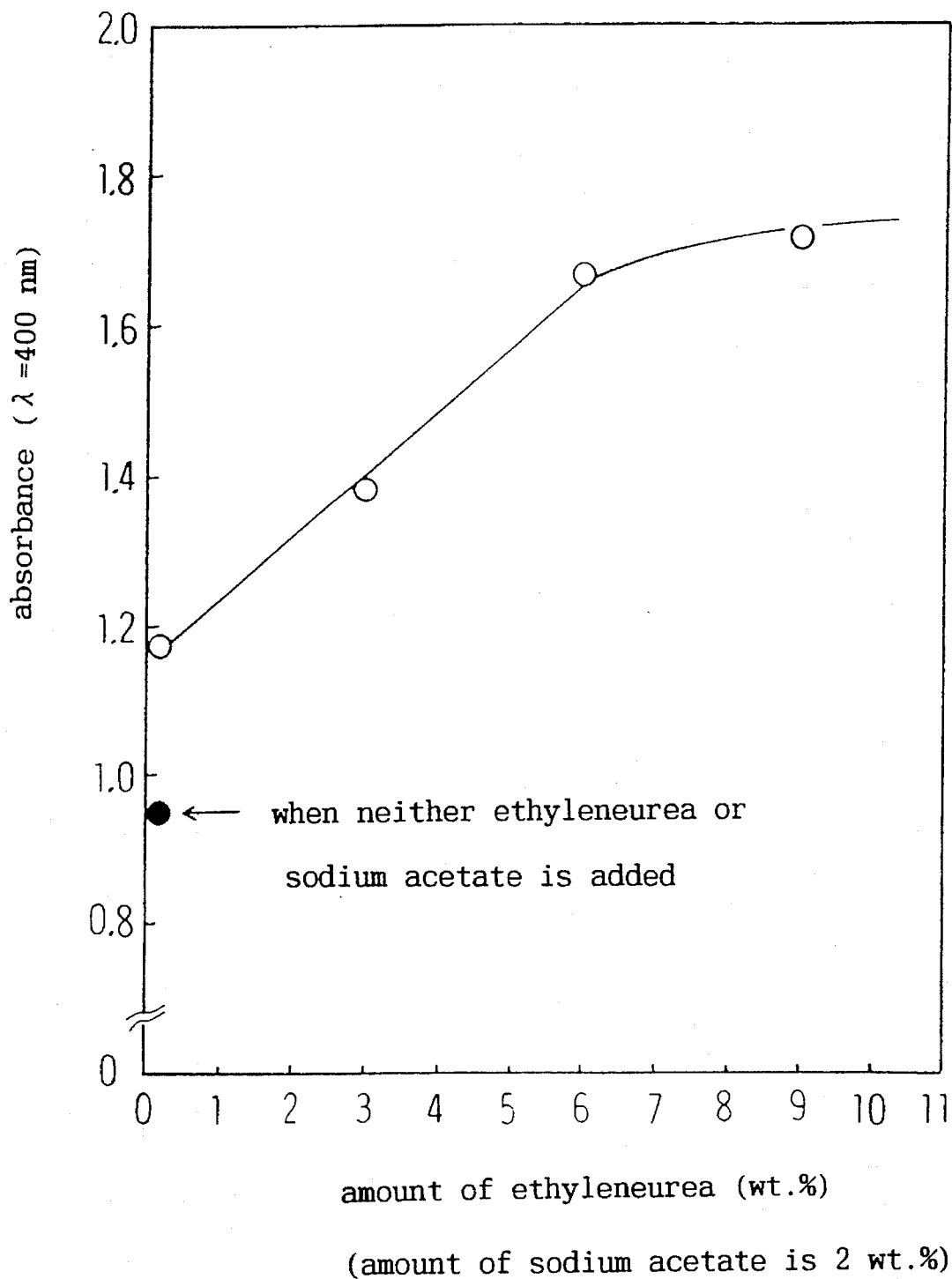
FIG. 7 indicates the absorbance of red filter of Example 2 of this invention when varying amounts of sodium acetate and urea compound (ethyleneurea) are added to the aqueous dyestuff solution.

FIG. 6 shows the relation between the photo-absorption rate ($\lambda=400$ nm) of the spectrum of the dyed filter and the amount of sodium acetate as additive. FIG. 7 shows the absorbance of the red filter ($\lambda=400$ nm) when varying amounts of sodium acetate and urea compound (ethyleneurea) are added. It is clear from the graph that dyeing is promoted by adding sodium acetate. Dyeing will be further promoted by adding urea compound (ethyleneurea) along with the sodium acetate. The above-mentioned materials were added to the; aqueous dyestuff solution in the amounts shown in the following description.

| | |
|---|---|
| (1) red dyestuff (NIPPON KAYAKU Co., Ltd., chrome dye, trade name: Pc Red) | 2 weight parts |
| (2) pure water | 918 weight parts |
| (3) sodium acetate | 20 weight parts |
| (4) ethyleneurea | 60 weight parts |

The dyeing was carried out at the temperature of 70° C. for 20 minutes.

FIG. 8 shows the spectral characteristics of the filter of 0.7 µm thick which was formed in the above-mentioned aqueous dyestuff solution. It is clear from the graph that the preferable spectrum appears even if the filter is thin. Some dyestuffs like the red dye of this example often generate ammonium salt of the dye by adding ammonium acetate. By adding sodium acetate, the number of particles of 0.3 µm or more in size can be reduced to 20 or less per 10 ml of the aqueous dyestuff solution.

After being dyed, the dyeing layers were treated in a solution such as tannic acid aqueous solution and potassium antimonyl-tartrate solution to fix the dyestuff and to prevent decoloring and color mixing (FIG. 5(b)).

Next, a blue layer 14 was formed by being dyed with the following blue dyestuff in the same manner of the above mentioned red layer 13 (FIG. 5(c)).

| | |
|---|---|
| (1) blue dyestuff (NIPPON KAYAKU Co., Ltd., triphenylmethane dye, trade name: Pc Blue) | 1 weight part |
| (2) pure water | 999 weight parts |

The dyeing was carried out at the temperature of 70° C. for 20 minutes.

Furthermore a green layer 15 was formed in the same manner as mentioned above (FIG. 5(d)).

| | |
|---|---|
| (1) green dyestuff (NIPPON KAYAKU Co., Ltd., copper phthalocyanine dye, trade name: Pc Green) | 1 weight part |
| (2) pure water | 999 weight parts |

The dyeing was carried out at the temperature of 70° C. for 20 minutes.

Subsequently, the color filter was coated with a transparent planarization layer 16 of 0.3 to 1.0 µm thick (the material is e.g. acrylic resin) to flatten the surface of the color filter (FIG. 5(e)) in the same way as Example 1. Then microlens 17 was formed by coating lens material, exposing selectively, developing, and treating with heat in the same manner of Example 1 (FIG. 5(f)).

In the example, the thickness of the color filter (from the solid state imaging element to the bottom of the microlens 7) was as thin as 4.0 to 4.5 µm.

Figure 9:
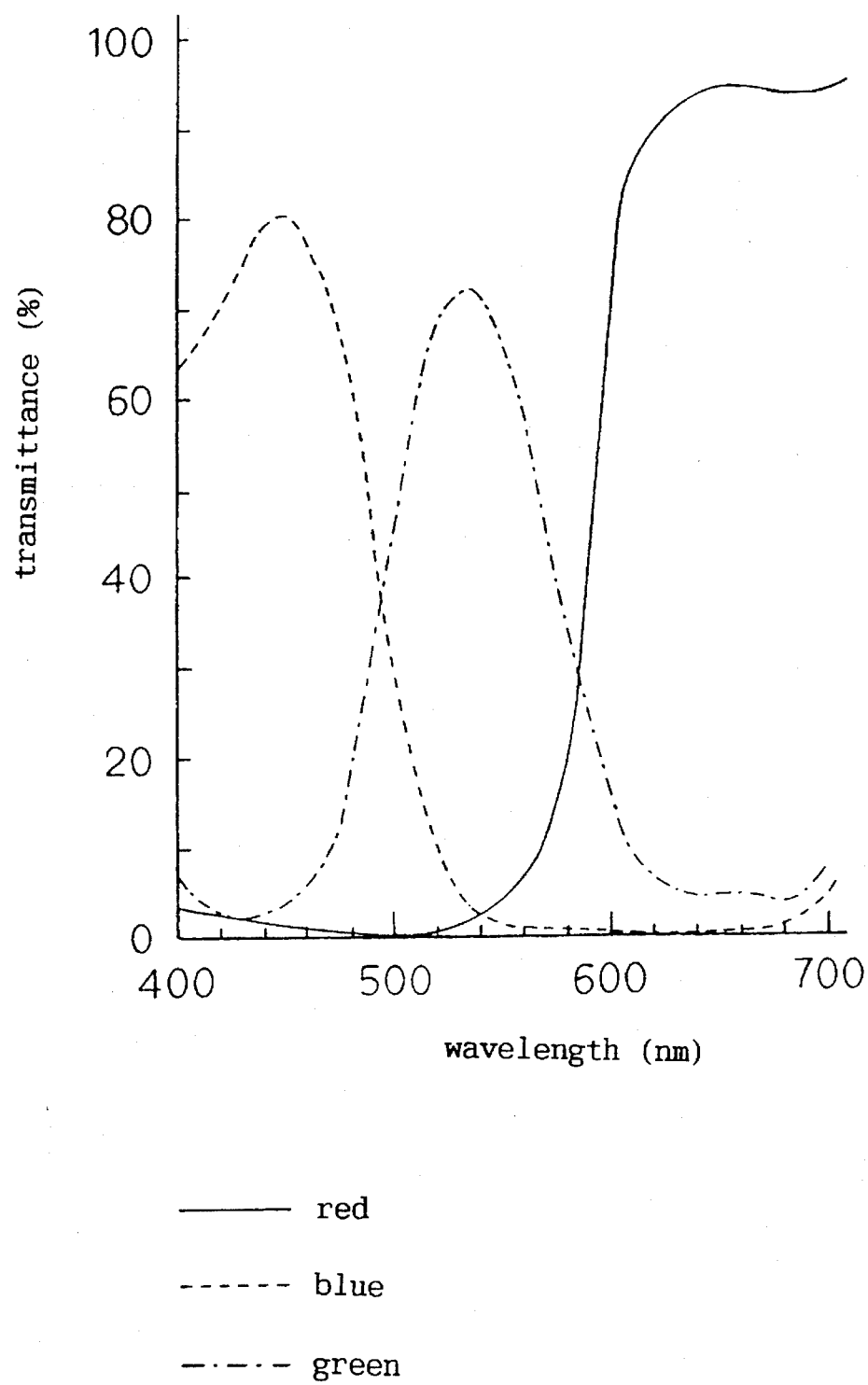
FIG. 9 indicates the spectral characteristics of the colors of the color filter of Example 1 of the invention.

FIG. 9 shows spectral characteristics of the colors of the color filter of this example.

The order of the filter forming method of the invention is not necessarily limited to the above-mentioned illustrative example. Sodium acetate, which was added in the process of forming a red layer of the invention, is also effective for the process of forming a blue layer and/or green layer.

EXAMPLE 3

FIG. 10(a) to FIG. 10(d) are a flow chart of cross-sectional views showing the method of manufacturing a solid state imaging device of one embodiment of the invention. In FIG. 10(a) to 10(d), number 18 is a semiconductor substrate on which a solid state imaging element is formed. 19 is a planarization resin layer, 20 is a shading layer, 21 is a planarization resin layer, and 22 is a microlens.

Figure 10:
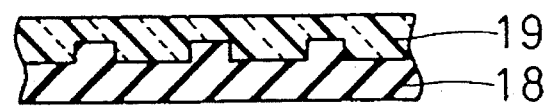
FIG. 10(a) to FIG. 10(d) are cross-sectional views showing the method of manufacturing the solid state imaging device of Example 3 of this invention.
Figure 10:
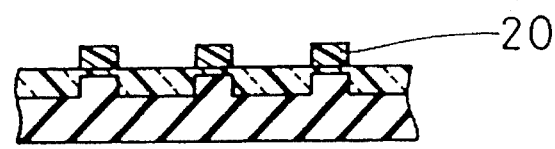
Figure 10:
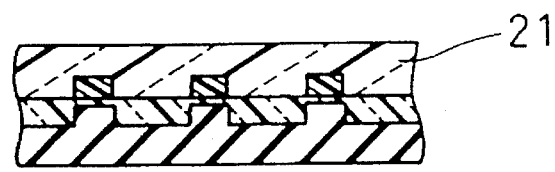
Figure 10:
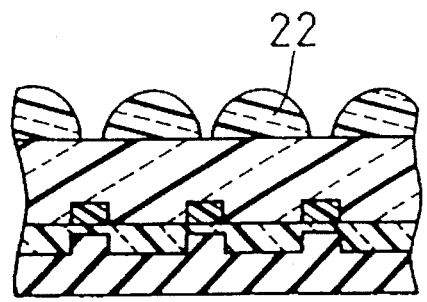

A transparent planarization resin layer 19 (the material is e.g. acrylic resin) is formed on a semiconductor substrate 18 on which a solid state imaging element is formed (FIG. 10(a)).

A synthetic resin (methacrylate resin) was prepared and added photosensitizer of diazo compound. On the planarization resin layer 19, the dyeable material layer of the synthetic resin was coated to be 0.2 to 0.8 μm thick by, for example, a spincoat method. Then, the synthetic resin was selectively exposed with a stepper, and developed to form patterns of a shading layer. Thereafter, the resin with the pattern was dyed with black dyestuff to be a shading layer 20. 3In the step, potassium acetate was added to the aqueous dyestuff solution.

Figure 11:
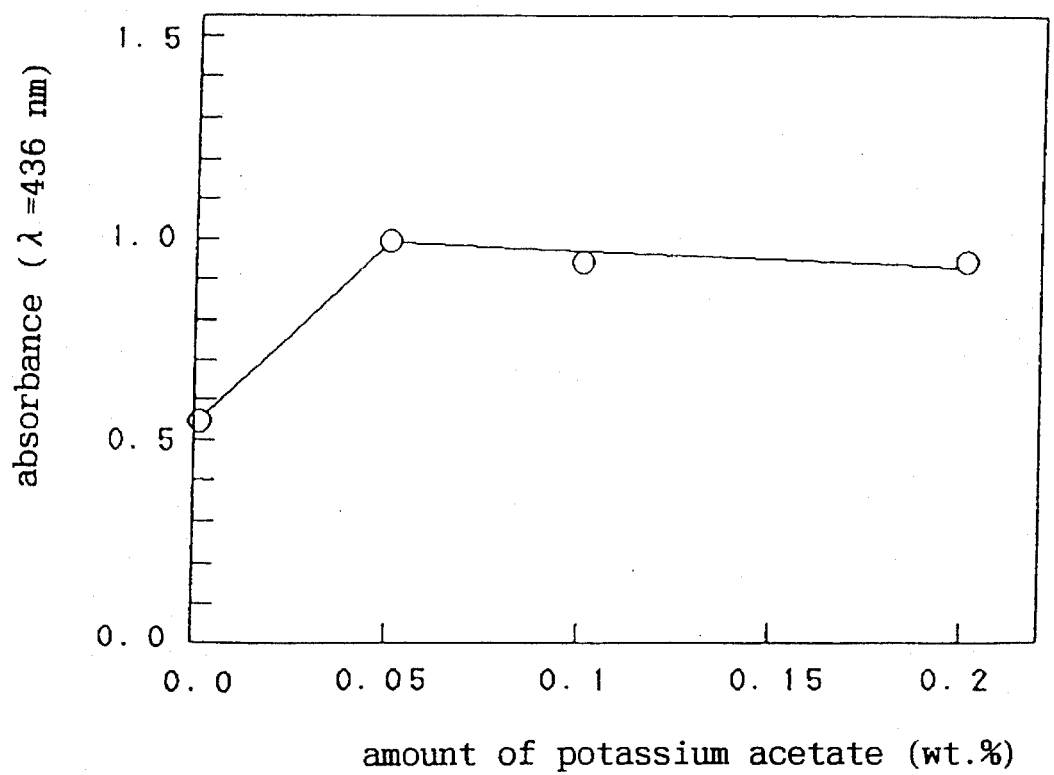
FIG. 11 indicates the relation between the amount of additive (potassium acetate) and the absorbance of the filters of Example 3 of this invention.
Figure 12:
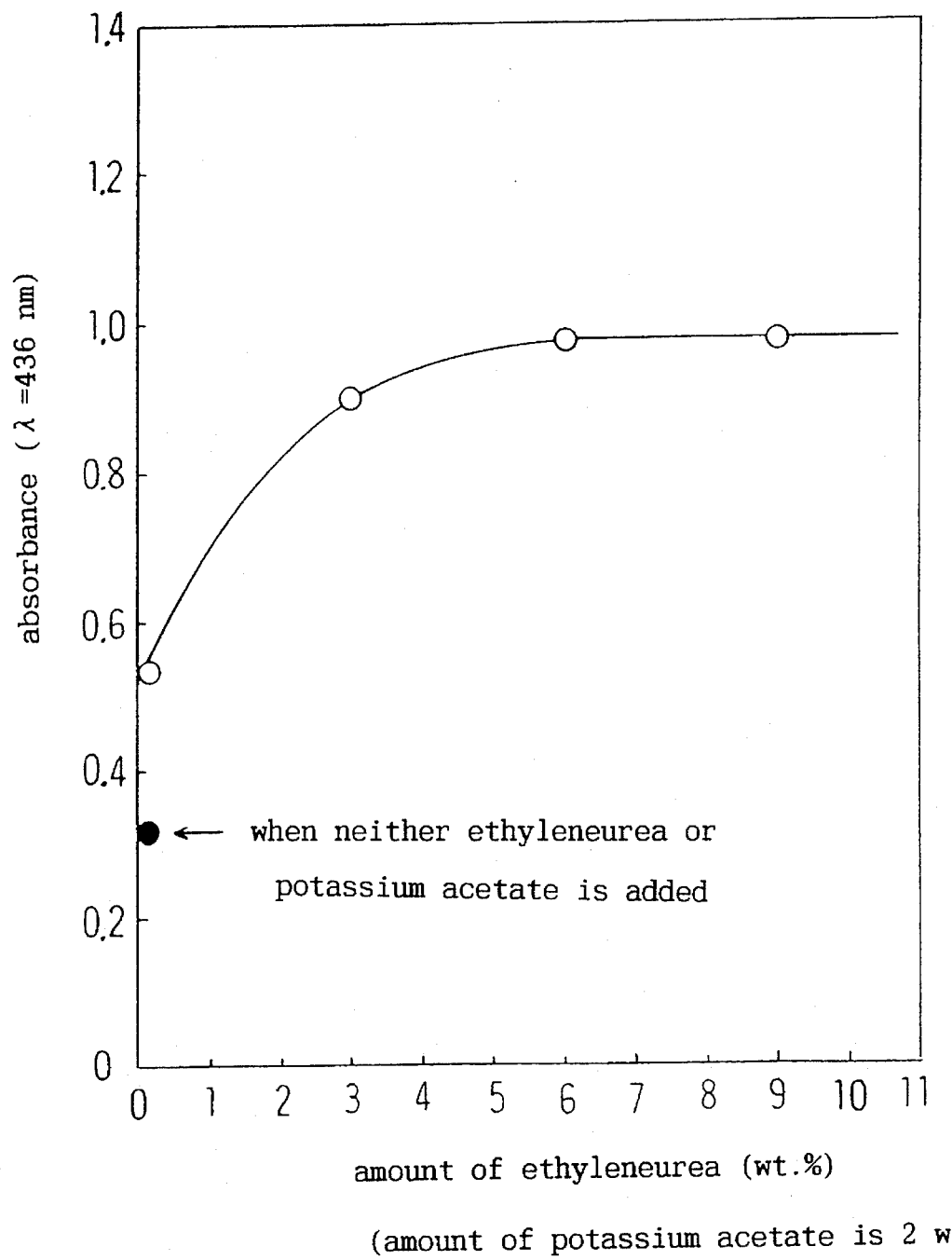
FIG. 12 indicates absorbance of the black filter of Example 3 of this invention when varying amounts of potassium acetate and urea compound (ethyleneurea) are added to the aqueous dyestuff solution.

FIG. 11 shows the relation between the absorbance (λ=436 nm) of the spectrum of the dyed filter and the amount of potassium acetate as additive. FIG. 12 shows absorbance of the black filter (λ=436 nm) when varying amounts of potassium acetate and urea compound (ethyleneurea) were added to the dyeing solution. It is clear from the graph that dyeing will be promoted by adding potassium acetate. It is also clear that dyeing is further promoted when a urea compound (ethyleneurea) is added along with the potassium acetate. Thus the above-mentioned material was added to the aqueous dyestuff solution in the amounts shown in the following description.

| | |
|---|---|
| (1) black dyestuff (NIPPON KAYAKU Co., Ltd., chrome dye, trade name:Pc Black) | 2 weight parts |
| (2) pure water | 978 weight parts |
| (3) potassium acetate | 20 weight parts |

The dyeing was carried out at the temperature of 70° C. for 20 minutes.

Figure 13:
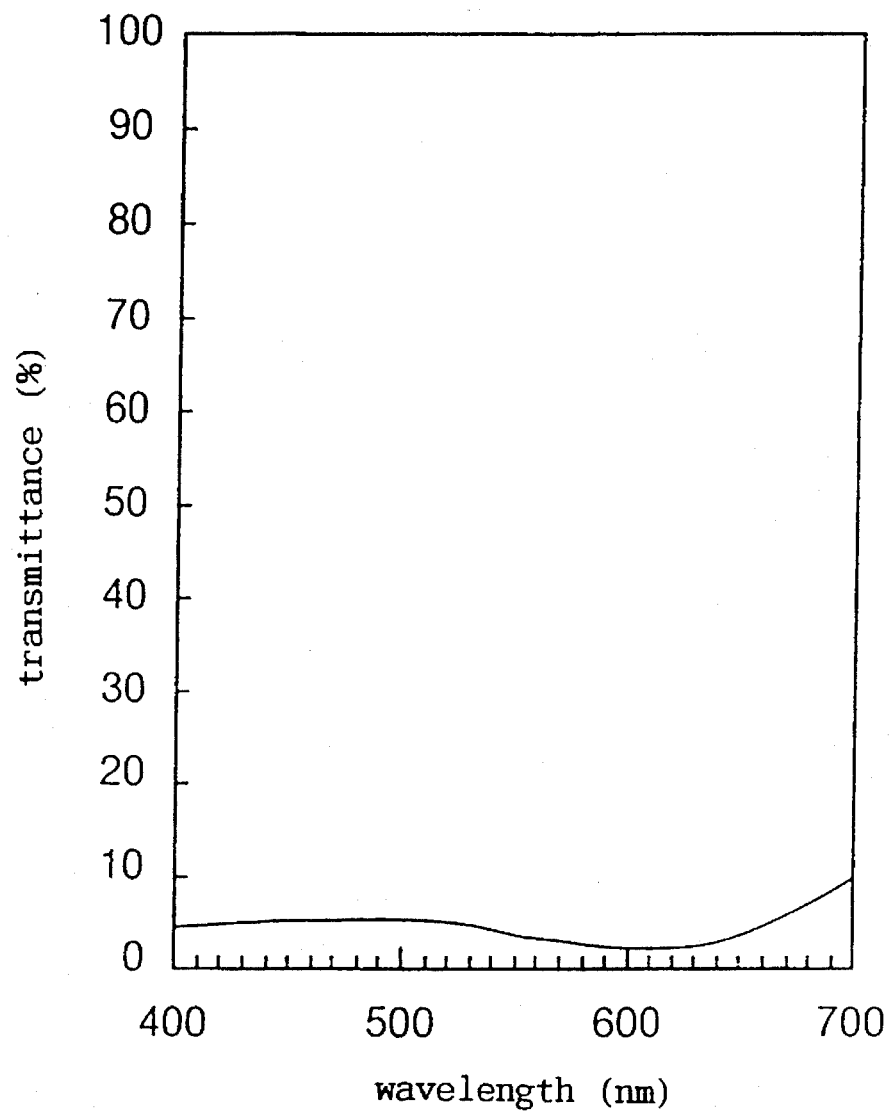
FIG. 13 indicates the spectral characteristics of the shading filter of Example 3 of the invention.

FIG. 13 shows the spectral characteristics of the filter of 0.6 μm thick which was formed in the above-mentioned aqueous dyestuff solution. It is clear from the graph that the preferable spectrum appears even if the filter is thin.

Some dyestuffs like the black dye of this example often generate ammonium salt of the dye by adding ammonium acetate. By adding potassium acetate, number of such particles of 0.3 μm or more in size can be reduced to 20 or less per 10 ml of the aqueous dyestuff solution.

Subsequently, the filter was coated with a transparent planarization layer 21 of 0.3 to 0.5 μm thick (the material is e.g. acrylic resin) to flatten the surface of the filter (FIG. 10(c)) in the same way as Example 1. Then microlens 22 was formed by coating lens material, exposing selectively, developing, and treating with heat in the same manner of Example 1 (FIG. 10(d)).

As illustrated in the Examples 1 to 3 which are described above, this invention can provide a solid state imaging device with a color filter which is dyed densely, is flat, thin, and excellent in spectral characteristics. Moreover, the method of the invention can increases yield in manufacturing a solid state imaging device, since particles, which are generated from aggregation of additives such as dyestuffs, decrease.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A method of manufacturing a solid state imaging device comprising forming dyeing layers of acrylic-based resin on a semiconductor substrate on which a solid state imaging element is formed and adding carboxylate and a urea compound as dyeing assistant auxiliaries in an aqueous dyestuff solution in the step of forming the dyeing layers of acrylic-based resin on the semiconductor substrate, wherein the urea is added to the aqueous dyestuff solution in an amount of from 0.1 to 10 weight percent based on the amount of the aqueous dyestuff solution.

2. The method of manufacturing a solid state imaging device according to claim 1, wherein the carboxylate is at least one salt selected from the group consisting of ammonium carboxylate and alkali metal carboxylate.

3. The method of manufacturing a solid state imaging device according to claim 2, wherein the alkali metal carboxylate is selected from the group consisting of sodium carboxylate and potassium carboxylate.

4. The method of manufacturing a solid state imaging device according to claim 1, wherein the carboxylate is at least one carboxylic acid salt selected from the group consisting of formic acid, acetic acid, propionic acid, n-butyric acid, isobutyric acid, valeric acid, trimethyl acetic acid, acrylic acid, and methacrylic acid.

5. The method of manufacturing a solid state imaging device according to claim 1, wherein the amount of carboxylate added is from 0.05 to 2 weight percent based on the amount of aqueous dyestuff solution.

6. The method of manufacturing a solid state imaging device according to claim 1, wherein the urea compound is $C_qH_rO_sN_t$, where q is from 1 to 5, r is from 4 to 10, s is 1, and t is 2.

7. The method of manufacturing a solid state imaging device according to claim 1, wherein the urea compound is ethyleneurea.

8. The method of manufacturing a solid state imaging device according to claim 1, wherein planarization resin layers, a shading layer, and multicolor dyeing layers are formed successively on the semiconductor substrate on which said solid state imaging element is formed.

9. The method of manufacturing a solid state imaging device according to claim 8, wherein the multicolor dyeing layers is at least one color selected from the group consisting of yellow, cyan, magenta, and green.

10. The method of manufacturing a solid state imaging device according to claim 8, wherein the multicolor dyeing layers is at least one color selected from the group consisting of red, blue, and green.

11. The method of manufacturing a solid state imaging device according to claim 1, wherein planarization resin layers and a shading layer comprising monocolor dyeing layer are formed successively on the semiconductor substrate on which said solid state imaging element is formed.

12. The method of manufacturing a solid state imaging device according to claim 11, wherein the monocolor dyeing layer is black.

13. The method of manufacturing a solid state imaging device according to claim 1, wherein the step of forming the dyeing layers comprises:

forming an acrylic-based resin layer (A), dyeing the acrylic-based resin layer (A) a color, and fixing the dye;

forming another acrylic-based resin layer (B), dyeing the acrylic-based resin layer (B) another color, and fixing the dye.

14. The method of manufacturing a solid state imaging device according to claim 13, wherein the acrylic-based resin layer (A) and the other acrylic-based resin layer (B) are adjacent or partly overlapping each other from a cross-sectional view.

* * * * *